(12) United States Patent
Wang et al.

(10) Patent No.: US 12,238,852 B2
(45) Date of Patent: Feb. 25, 2025

(54) CIRCUIT BOARD AND METHOD FOR MANUFACTURING THE SAME

(71) Applicants: Avary Holding (Shenzhen) Co., Limited., Shenzhen (CN); HongQiSheng Precision Electronics (QinHuangDao) Co., Ltd., Qinhuangdao (CN); GARUDA TECHNOLOGY CO., LTD., New Taipei (TW)

(72) Inventors: Ying Wang, Shenzhen (CN); Yong-Chao Wei, Qinhuangdao (CN)

(73) Assignees: Avary Holding (Shenzhen) Co., Limited., Shenzhen (CN); HongQiSheng Precision Electronics (QinHuangDao) Co., Ltd., Qinhuangdao (CN); GARUDA TECHNOLOGY CO., LTD., New Taipei (TW)

( * ) Notice: Subject to any disclaimer, the term of this patent is extended or adjusted under 35 U.S.C. 154(b) by 216 days.

(21) Appl. No.: 18/089,005

(22) Filed: Dec. 27, 2022

(65) Prior Publication Data

US 2023/0125928 A1    Apr. 27, 2023

Related U.S. Application Data

(62) Division of application No. 17/354,461, filed on Jun. 22, 2021, now Pat. No. 11,570,883.

(30) Foreign Application Priority Data

May 18, 2021    (CN) .......................... 202110541485.5

(51) Int. Cl.
H05K 1/03       (2006.01)
H05K 1/02       (2006.01)
(Continued)

(52) U.S. Cl.
CPC ......... *H05K 1/0204* (2013.01); *H05K 1/0206* (2013.01); *H05K 1/0306* (2013.01);
(Continued)

(58) Field of Classification Search
CPC ................. H05K 1/0306; H05K 1/036; H05K 2201/0323; H05K 1/021
See application file for complete search history.

(56) References Cited

U.S. PATENT DOCUMENTS 10,859,330 B1 * 12/2020 Cola ....................... H02S 40/42
2004/0240181 A1 * 12/2004 Chung ................... H01L 23/40
                                                    257/E23.083
(Continued)

FOREIGN PATENT DOCUMENTS

CN          108831837 A      11/2018

*Primary Examiner* — Jeremy C Norris
(74) *Attorney, Agent, or Firm* — ScienBiziP, P.C.

(57) ABSTRACT

A circuit board with improved heat dissipation function and a method for manufacturing the circuit board are provided. The circuit board includes a heat dissipation substrate, an insulating layer on the heat dissipation substrate, an electronic component, a base layer on the insulating layer, and a circuit layer on the base layer. The heat dissipation substrate includes a phase change structure and a heat conductive layer wrapping the phase change structure. The heat dissipation substrate defines a first through hole. The insulating layer defines a groove for receiving the electronic component. A second through hole is defined in the circuit layer, the base layer, and the insulating layer. A bottom of the second through hole corresponds to the heat conductive layer. A heat conductive portion is disposed in the second through hole.

7 Claims, 14 Drawing Sheets

(51) Int. Cl.
*H05K 1/18* (2006.01)
*H05K 3/46* (2006.01)
*H05K 3/42* (2006.01)

(52) U.S. Cl.
CPC ............ *H05K 1/036* (2013.01); *H05K 1/185* (2013.01); *H05K 3/4602* (2013.01); *H05K 3/4605* (2013.01); *H05K 3/423* (2013.01); *H05K 3/4697* (2013.01); *H05K 2201/0323* (2013.01); *H05K 2203/0723* (2013.01)

(56) References Cited

U.S. PATENT DOCUMENTS

2007/0074900 A1* 4/2007 Lee .................. H01L 24/19
                                                                               257/E23.178
2014/0370354 A1* 12/2014 Yang .................. H01M 50/227
                                                                               429/120

* cited by examiner

CIRCUIT BOARD AND METHOD FOR MANUFACTURING THE SAME

FIELD

The disclosure relates to printed circuit boards, and more particularly, to a circuit board with improved heat dissipation function and a method for manufacturing the circuit board.

BACKGROUND

Circuit boards may have electronic components that generate heat during operation. If the heat cannot be dissipated quickly, a safety performance and a service life of the circuit board may be affected.

BRIEF DESCRIPTION OF THE DRAWINGS

Many aspects of the disclosure can be better understood with reference to the following drawings. The components are not necessarily drawn to scale, the emphasis instead being placed upon clearly illustrating the principles of the disclosure.

DETAILED DESCRIPTION

Implementations of the disclosure will now be described, by way of embodiments only, with reference to the drawings. It should be noted that the embodiments and the features of the present disclosure can be combined without conflict. Specific details are set forth in the following description to make the present disclosure to be fully understood. The embodiments are only some and not all the embodiments of the present disclosure. Based on the embodiments of the present disclosure, other embodiments obtained by a person of ordinary skill in the art without creative efforts shall be within the scope of the present disclosure.

Unless defined otherwise, all technical and scientific terms used herein have the same meaning as commonly understood by one of ordinary skill in the art. The terms used herein in the specification of the present disclosure are only for describing the embodiments, and are not intended to limit the present disclosure. The term "and/or" as used herein includes any combination of one or more related items.

In the embodiments of the present disclosure, and not as a limitation of the present disclosure, the term "connection" used in the specification and claims of the present disclosure is not limited to physical or mechanical connection, no matter direct connection or indirect connection. The terms of "up", "down", "above", "below", "left", "right", etc., are only used to indicate the relative position relationship. When the absolute position of a described element changes, the relative positions correspondingly changes.

Figure 20:
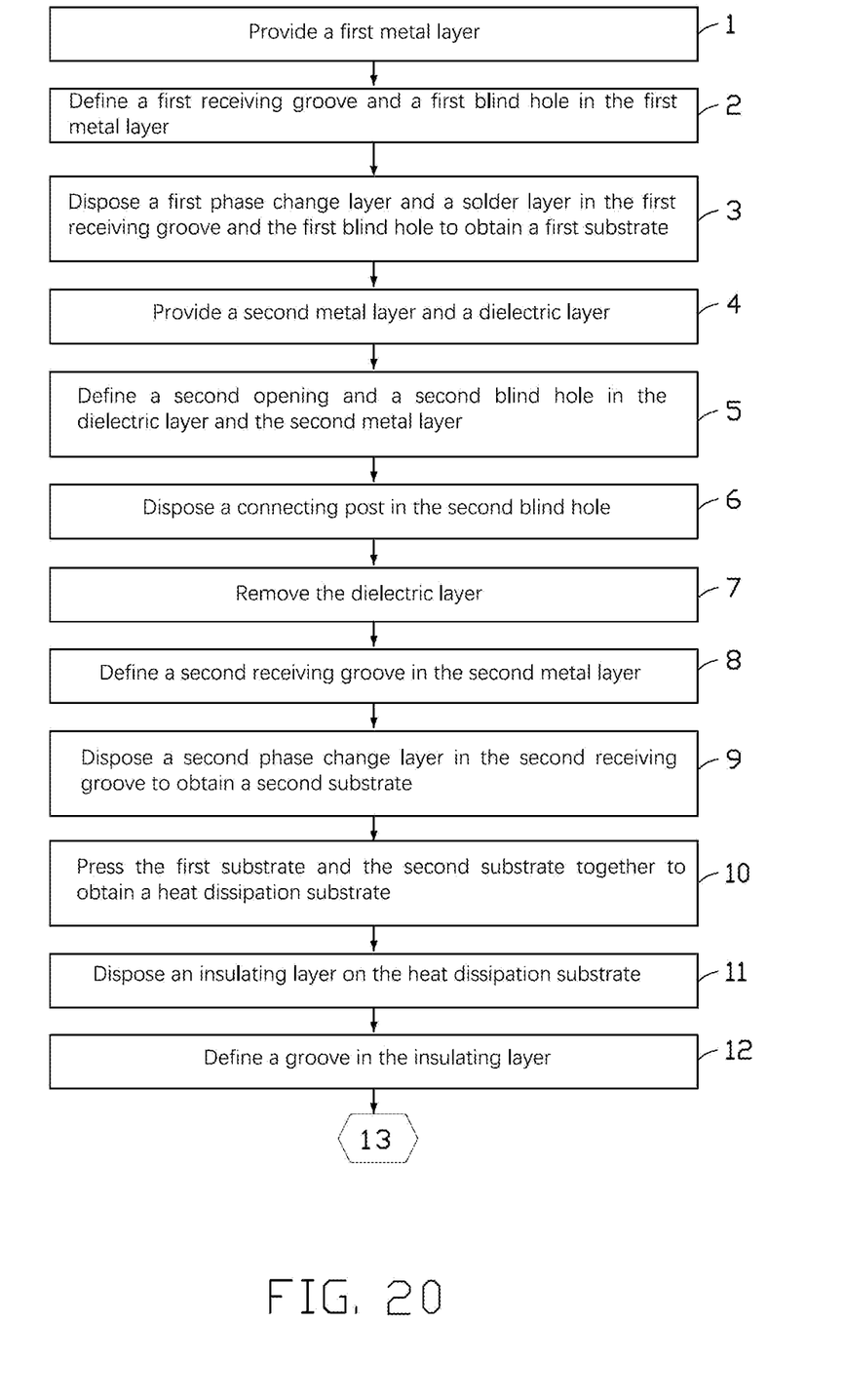
FIGS. 20 and 21 are a flowchart of an embodiment of a method for manufacturing a circuit board according to the present disclosure.
Figure 21:
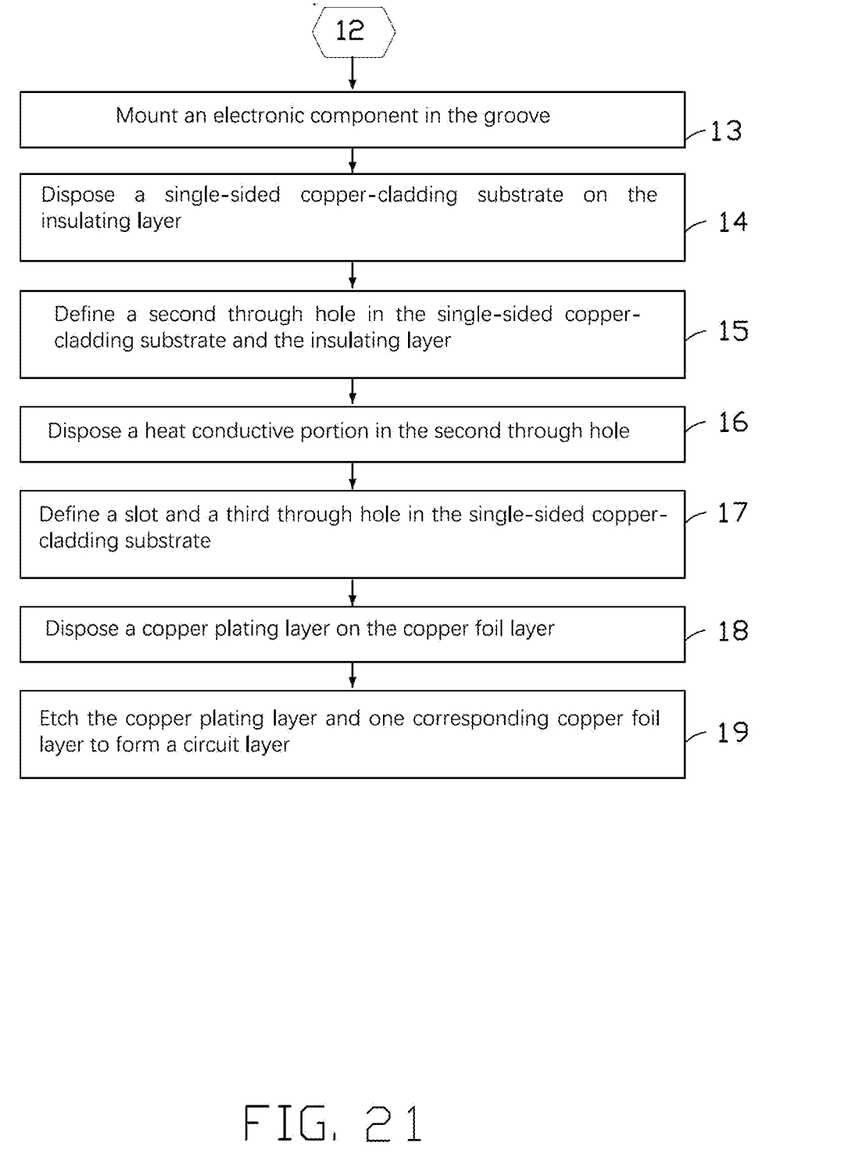

Referring to FIGS. 20 and 21, a method for manufacturing a circuit board is disclosed in one embodiment. The method is provided by way of example, as there are a variety of ways to carry out the method. The method can begin at block 1.

Figure 1:
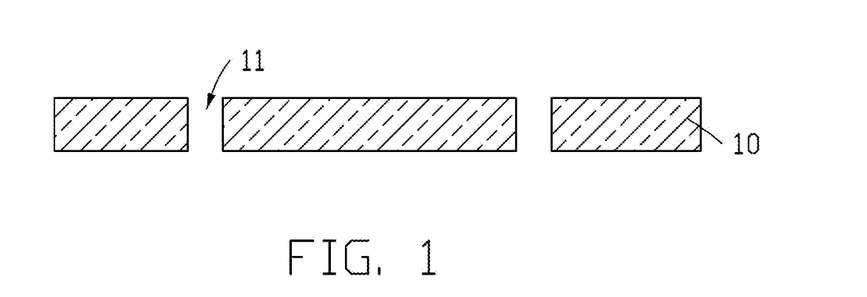
FIG. 1 is a diagrammatic view of an embodiment of a first metal layer according to the present disclosure.

At block 1, referring to FIG. 1, a first metal layer 10 is provided.

The first metal layer 10 defines a first opening 11 penetrating therethrough. In at least one embodiment, the first opening 11 may be formed by laser.

The first metal layer 10 has high mechanical strength and thermal conductivity. In at least one embodiment, the first metal layer 10 may be made of copper alloy, aluminum alloy, or copper aluminum alloy.

Figure 2:
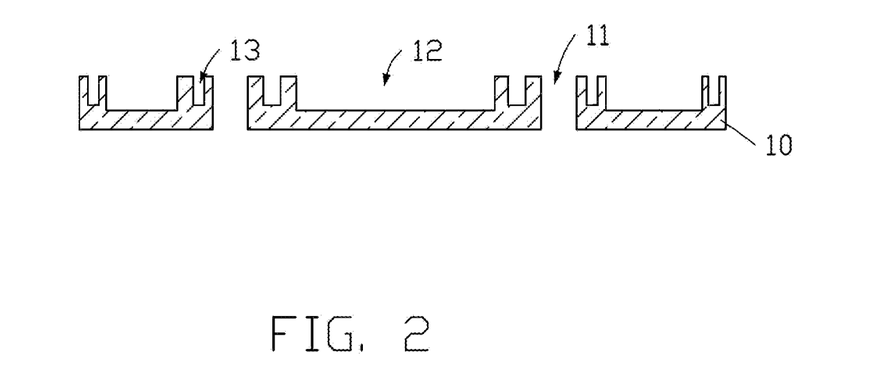
FIG. 2 is a diagrammatic view wherein a first receiving groove and a first blind hole is defined in the first metal layer of FIG. 1.

At block 2, referring to FIG. 2, at least one first receiving groove 12 and at least one first blind hole 13 are defined in the first metal layer 10.

The first receiving groove 12 and the first blind hole 13 defined on a same surface of the first metal layer 10. Each of the first receiving groove 12 and the first blind hole 13 does not penetrate through the first metal layer 10.

In at least one embodiment, each first receiving groove 12 is positioned between two adjacent first blind holes 13.

In at least one embodiment, the first receiving groove 12 and the first blind hole 13 may be formed by etching.

Figure 3:
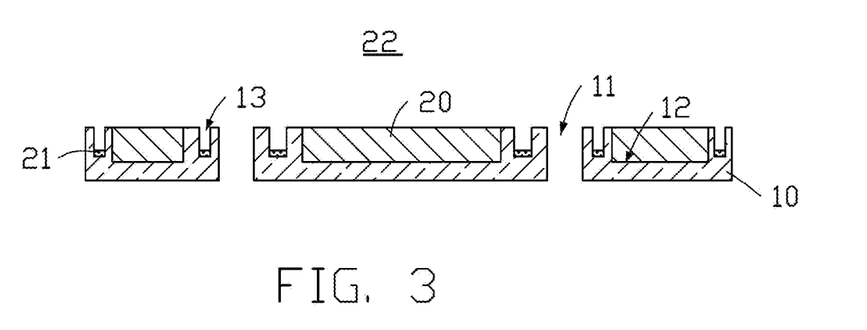
FIG. 3 is a diagrammatic view wherein a phase change layer and a solder layer are disposed in the first receiving groove and the first blind hole of FIG. 2.

At block 3, referring to FIG. 3, a phase change material is filled in the first receiving groove 12 to form a first phase change layer 20. A solder flux is filled in the first blind hole 13 to form a solder layer 21. Then, a first substrate 22 is obtained.

In at least one embodiment, the first phase change layer 20 may be made of paraffin ($C_nH_{2n+2}$), inorganic salt hydrate, or fatty acid. In at least one embodiment, the inorganic salt hydrate includes at least one of disodium phosphate dodecahydrate, calcium nitrate tetrahydrate, and sodium acetate trihydrate. The fatty acid includes at least one of lauric acid and myristic acid.

In at least one embodiment, the first phase change layer 20 infills the whole first receiving groove 12. The solder layer 21 only fills a bottom of the first blind hole 13.

Figure 4:
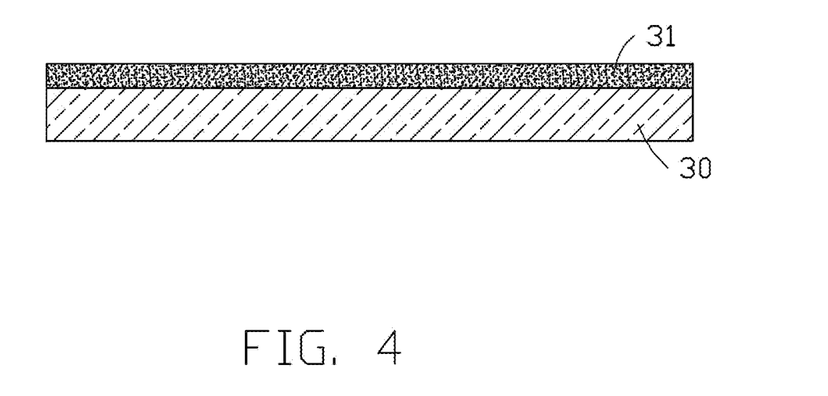
FIG. 4 is a diagrammatic view of an embodiment of a second metal layer according to the present disclosure.

At block 4, referring to FIG. 4, a second metal layer 30 and a dielectric layer 31 disposed on the second metal layer 30 are provided.

In at least one embodiment, the dielectric layer 31 may be a peelable film.

The second metal layer 30 and the first metal layer 10 may be made of a same material or different materials.

Figure 5:
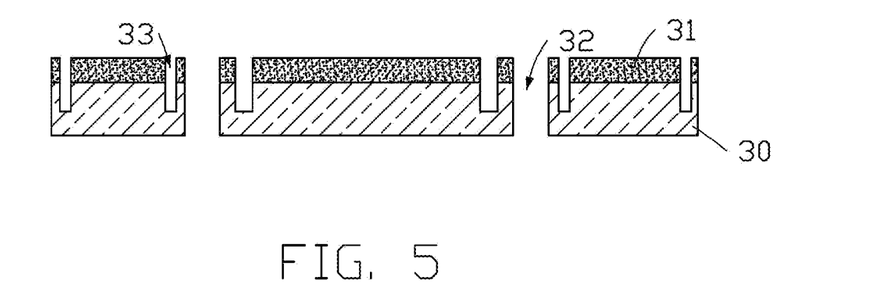
FIG. 5 is a diagrammatic view wherein a second opening and a second blind hole are defined in the dielectric layer and the second metal layer of FIG. 4.

At block 5, referring to FIG. 5, at least one second opening 32 and at least one second blind hole 33 are defined in the dielectric layer 31 and the second metal layer 30.

The second opening 32 penetrates through the dielectric layer 31 and the second metal layer 30. The second blind hole 33 penetrates through the dielectric layer 31 and a portion of the second metal layer 30.

In at least one embodiment, the second opening 32 and the second blind hole 33 may be formed by laser.

In at least one embodiment, each second opening 32 is disposed between two adjacent second blind holes 33.

Figure 6:
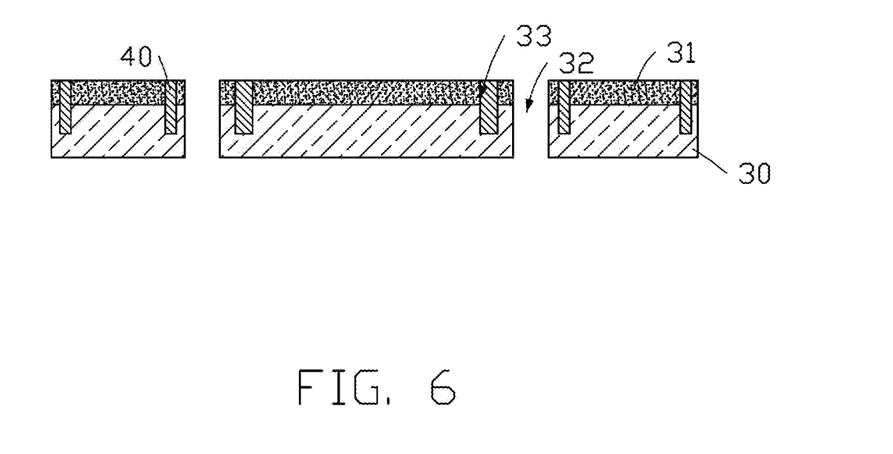
FIG. 6 is a diagrammatic view wherein a connecting post is disposed in the second blind hole of FIG. 5.

At block 6, referring to FIG. 6, metal is electroplated in the second blind hole 33 to form a connecting post 40.

In at least one embodiment, an end of the connecting post 40 away from the second metal layer 30 is substantially flush with a surface of the dielectric layer 31 away from the second metal layer 30.

Figure 7:
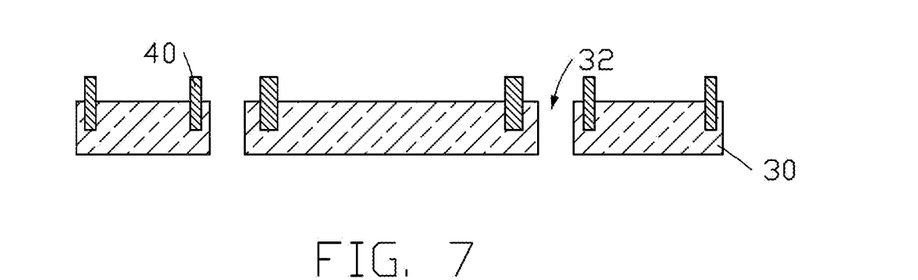
FIG. 7 is a diagrammatic view wherein the dielectric layer of FIG. 6 is removed.

At block 7, referring to FIG. 7, the dielectric layer 31 is removed, causing the end of the connecting post 40 away from the second metal layer 30 to protrude from the second metal layer 30.

Figure 8:
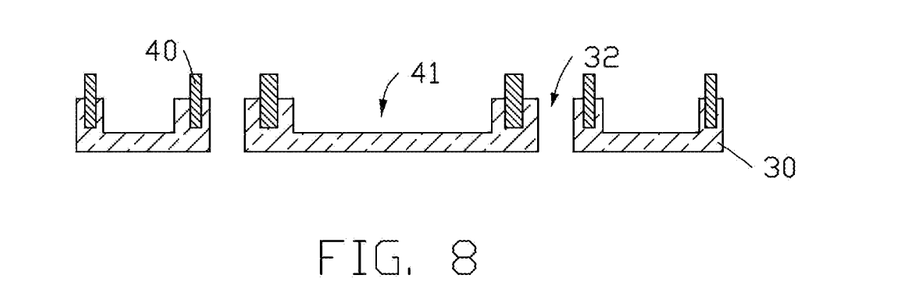
FIG. 8 is a diagrammatic view wherein a second receiving groove is defined in the second metal layer of FIG. 7.

At block 8, referring to FIG. 8, at least one second receiving groove 41 is defined in the second metal layer 30.

The second receiving groove 41 and the connecting post 40 are disposed on a same surface of the second metal layer 30, and the second receiving groove 41 does not penetrate through the second metal layer 30. In at least one embodiment, each second receiving grooves 41 is disposed between two adjacent connecting posts 40.

In at least one embodiment, the second receiving groove 41 may be formed by etching.

Figure 9:
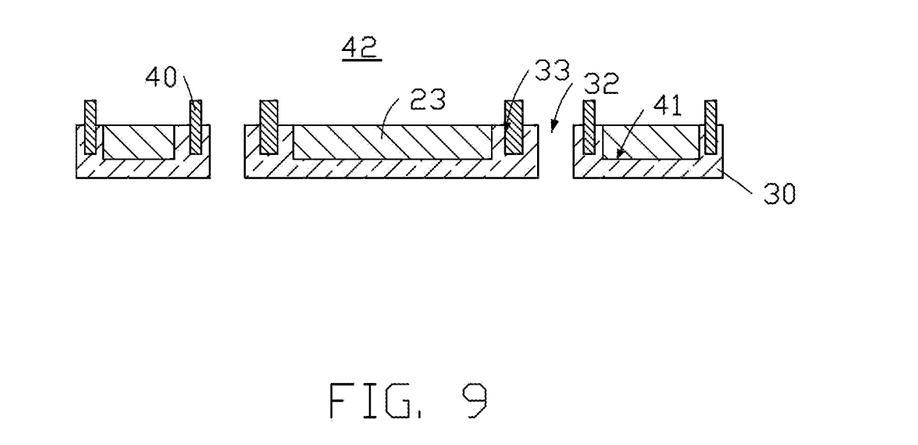
FIG. 9 is a diagrammatic view wherein a second phase change layer is disposed in the second receiving groove of FIG. 8.

At block 9, referring to FIG. 9, a phase change material is filled in the second receiving groove 41 to form a second phase change layer 23. Then, a second substrate 42 is obtained.

In at least one embodiment, the second phase change layer 23 and the first phase change layer 20 may be made of a same material or different materials.

Figure 10:
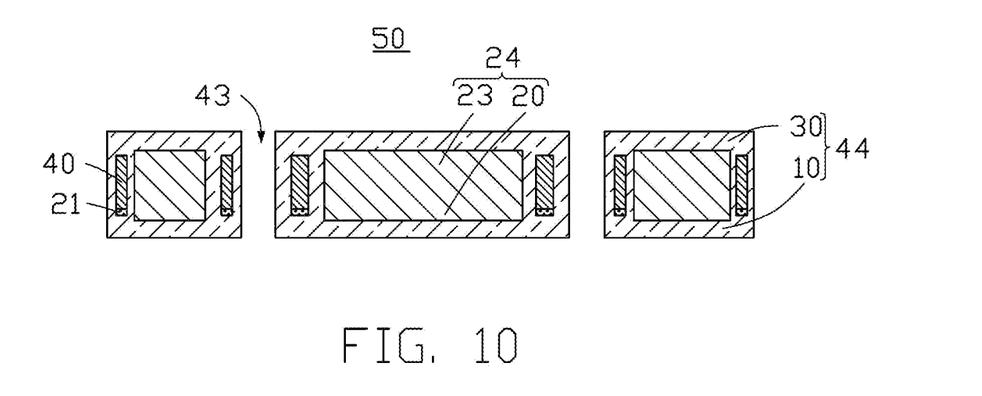
FIG. 10 is a diagrammatic view wherein the first substrate of FIG. 3 and the second substrate of FIG. 9 are pressed together.

At block 10, referring to FIG. 10, the first substrate 22 and the second substrate 42 are pressed together, causing the connecting post 40 to be disposed in the first blind hole 13 and connected to the solder layer 21. Furthermore, the first opening 11 and the second opening 32 are aligned with each other to form a first through hole 43. The first metal layer 10 and the second metal layer 30 are connected to each other to form a heat conductive layer 44. The phase change layer 20 and the second phase change layer 23 are connected to each other to form a phase change structure 24, and the phase change structure 24 is wrapped by the heat conductive layer 44. Then, a heat dissipation substrate 50 is obtained.

The first through hole 43 penetrates through the heat dissipation substrate 50.

In at least one embodiment, the solder layer 21 and the connecting post 40 can fix the first substrate 22 to the second substrate 42.

Figure 11:
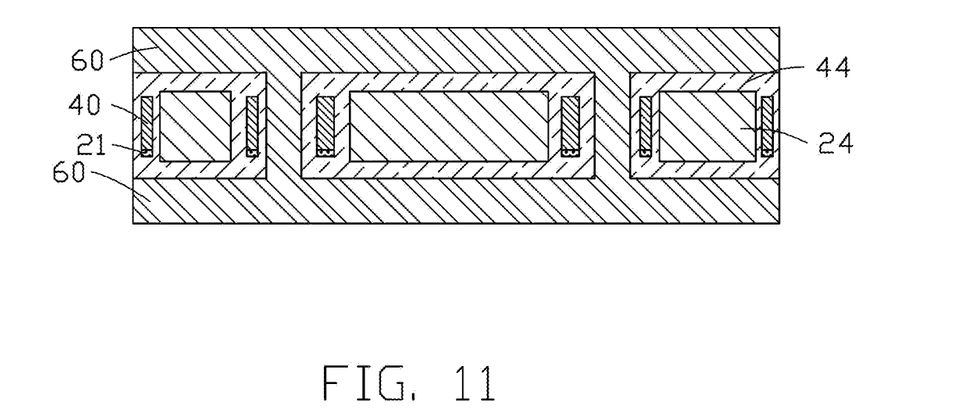
FIG. 11 is a diagrammatic view wherein an insulating layer is disposed on the heat dissipation substrate of FIG. 10.

At block 11, referring to FIG. 11, two insulating layers 60 are formed on two opposite surfaces of the heat dissipation substrate 50. The insulating layers 60 also infill the first through hole 43.

The insulating layers 60 can be made of a material selected from epoxy resin, polypropylene (PP), BT resin, polyphenylene oxide (PPO), polyimide (PI), polyethylene terephthalate (PET), and polyethylene naphthalate (PEN).

Figure 12:
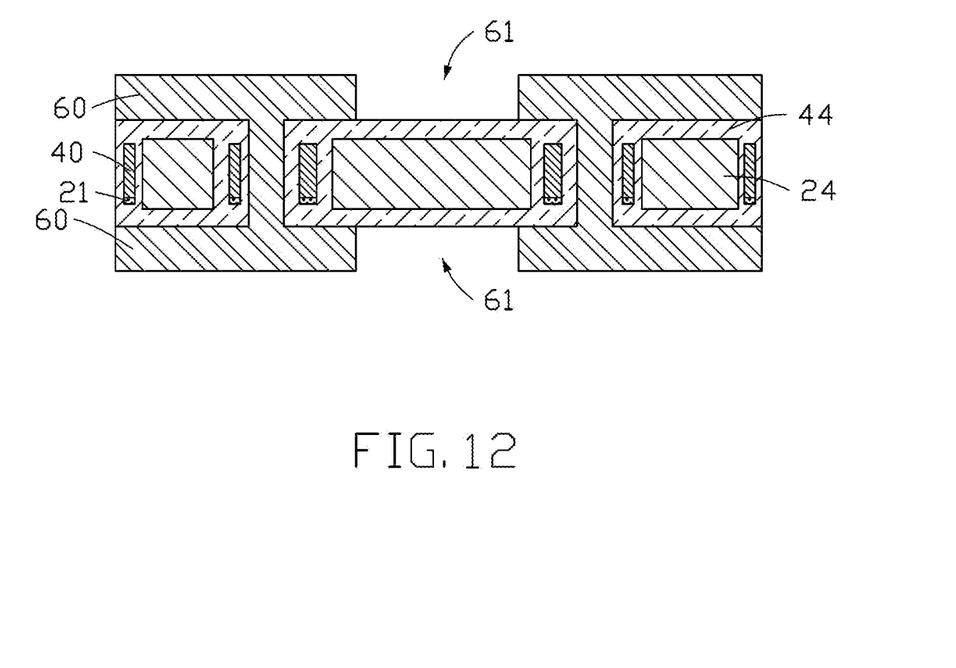
FIG. 12 is a diagrammatic view wherein a groove is defined in the insulating layer of FIG. 11.

At block 12, referring to FIG. 12, a groove 61 is defined in each of the insulating layers 60. A bottom of the groove 61 corresponds to the heat conductive layer 44, and the heat conductive layer 44 is partially exposed from the groove 61.

Figure 13:
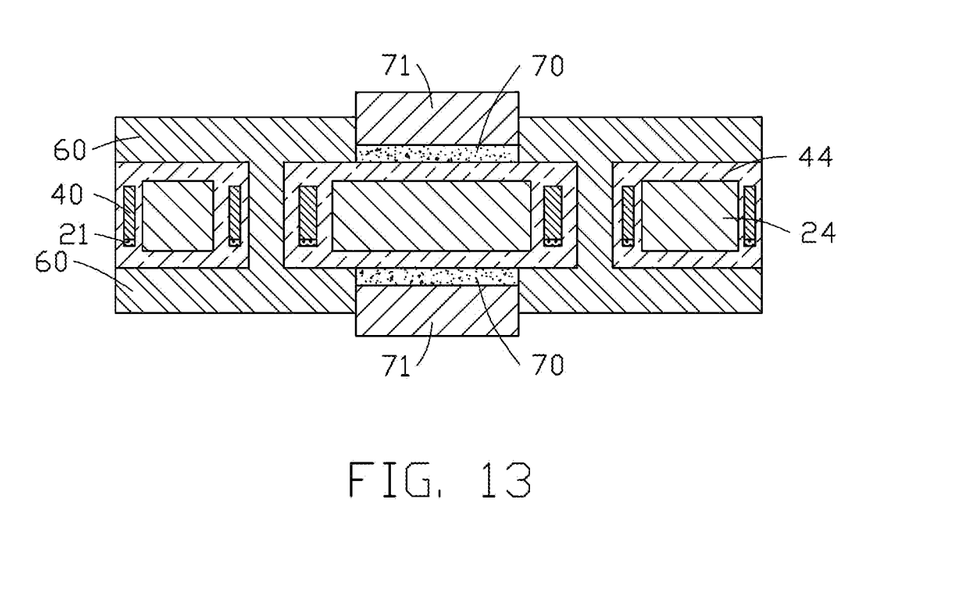
FIG. 13 is a diagrammatic view wherein a bonding sheet is disposed in the groove of FIG. 12.

At block 13, referring to FIG. 13, an electronic component 70 is mounted in each groove 61 through a bonding sheet 70. The bonding sheet 70 is in thermal conduction with the heat conductive layer 44.

The bonding sheet 70 has a high thermal conductivity. In at least one embodiment, the bonding sheet 70 may be made of silica gel or acrylic resin with high conductivity.

In at least one embodiment, the electronic component 71 may partially protrude from the insulating layer 60.

During working, the heat generated by each electronic component 71 can be transmitted to the phase change structure 24 through the bonding sheet 70 and the heat conductive layer 44. The phase change structure 24 absorbs the heat. Thus, the temperature of the electronic component 71 can be reduced.

Figure 14:
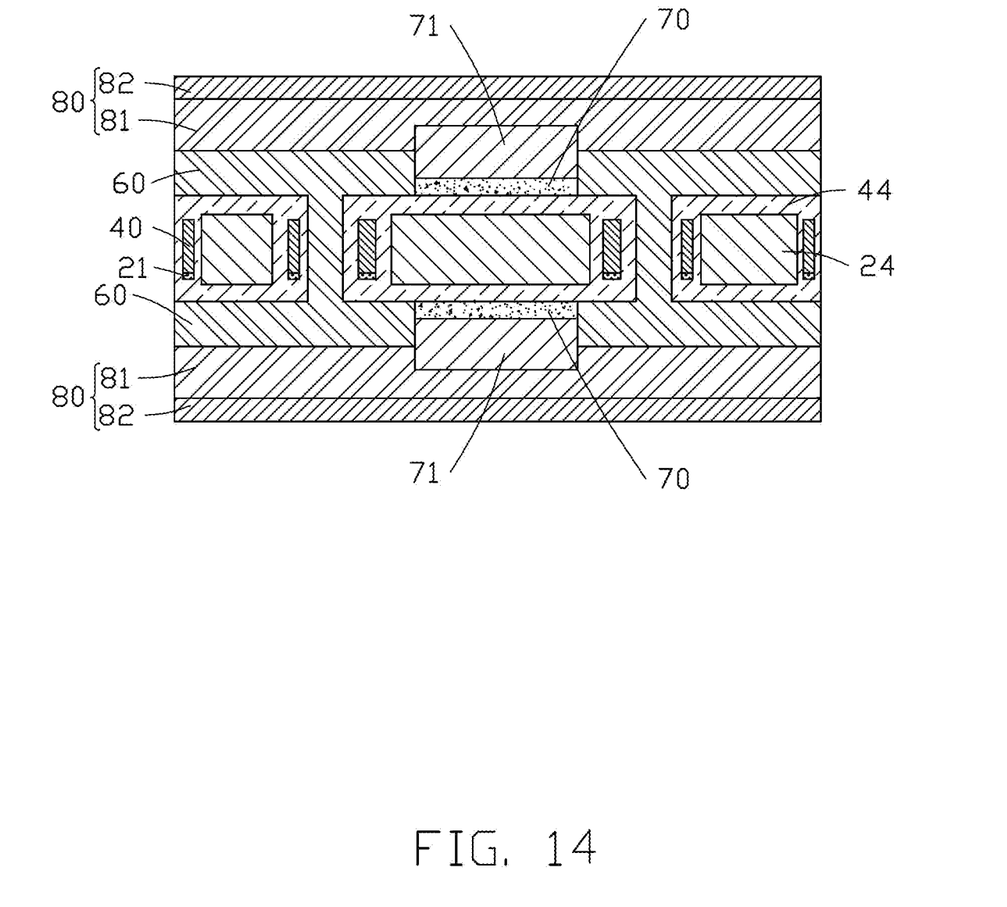
FIG. 14 is a diagrammatic view wherein a single-sided copper-cladding substrate is disposed on the insulating layer of FIG. 13.

At block 14, referring to FIG. 14, a single-sided copper-cladding substrate 80 is disposed on each insulating layer 60.

In at least one embodiment, each single-sided copper-cladding substrate 80 includes a base layer 81 and a copper foil layer 82. The base layer 81 is between the copper foil layer 82 and the electronic component 71. The portion of the electronic component 71 protruding from the insulating layer 60 is embedded in the base layer 81.

The base layer 81 can be made of a material selected from epoxy resin, polypropylene, BT resin, polyphenylene oxide, polyimide, polyethylene terephthalate, and polyethylene naphthalate.

Figure 15:
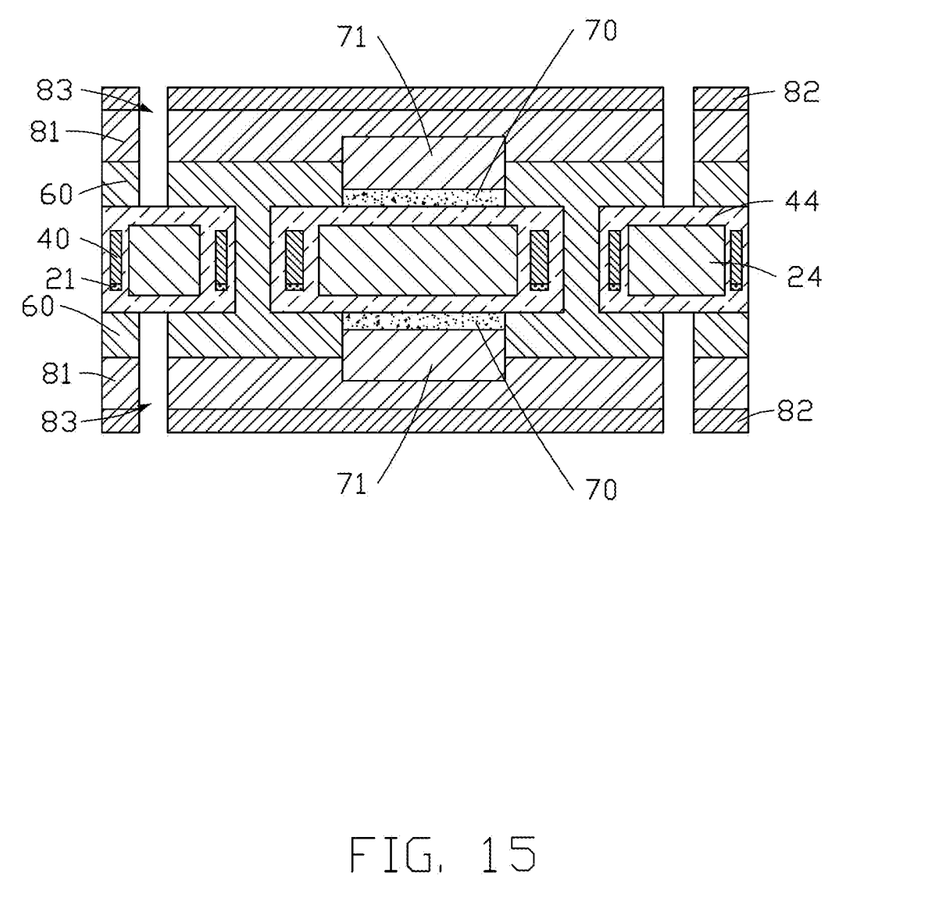
FIG. 15 is a diagrammatic view wherein a second through hole is defined in the single-sided copper-cladding substrate and the insulating layer of FIG. 14.

At block 15, referring to FIG. 15, a second through hole 83 is defined in each single-sided copper-cladding substrate 80 and the insulating layer 60. A bottom of the second through hole 83 corresponds to the heat conductive layer 44.

Figure 16:
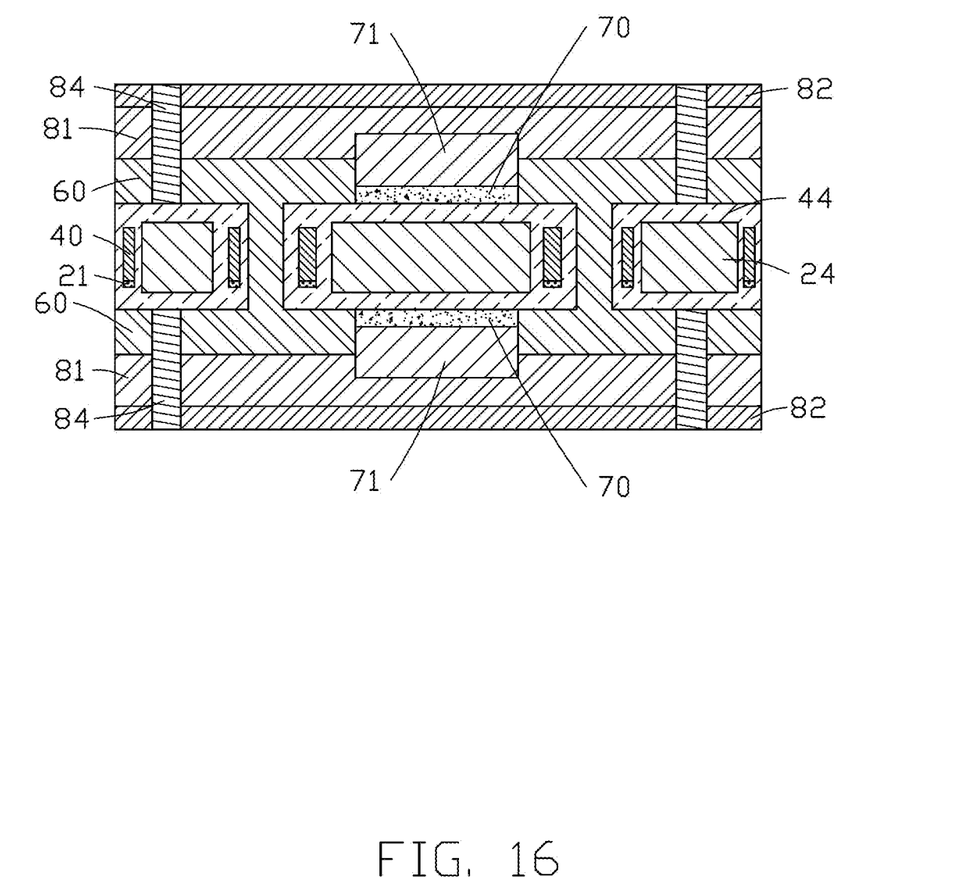
FIG. 16 is a diagrammatic view wherein a heat conductive portion is disposed in the second through hole of FIG. 15.

At block 16, referring to FIG. 16, a heat conductive material is filled in each second through hole 83 to form a heat conductive portion 84. The heat conductive portion 84 is in thermal conduction with the heat conductive layer 44.

In at least one embodiment, the heat conductive material may be graphite sheet, heat conductive gel, or silicone. In other embodiments, the heat conductive portion 84 may also be formed by plating tin in the second through hole.

Figure 17:
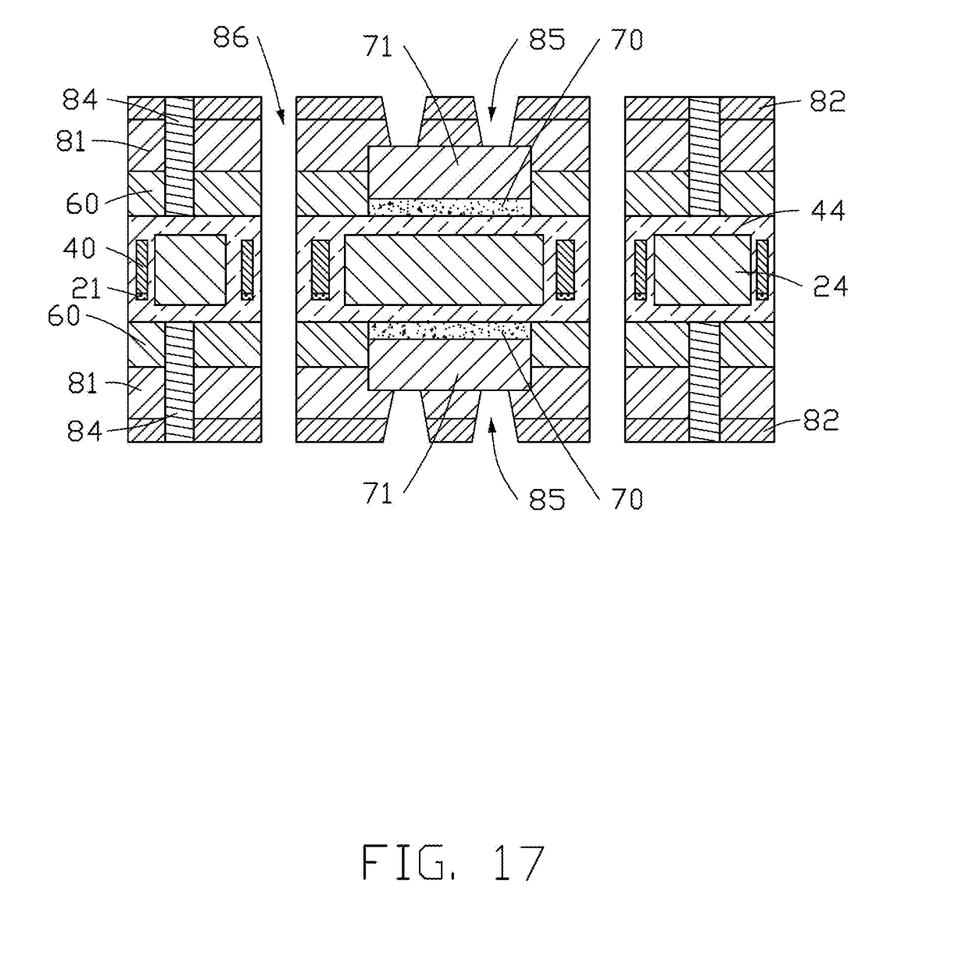
FIG. 17 is a diagrammatic view wherein a slot and a third through hole are defined in the single-sided copper-cladding substrate of FIG. 16.

At block 17, referring to FIG. 17, a slot 85 is defined in each single-sided copper-cladding substrate 80, a bottom of the slot 85 corresponds to the electronic component 71. A third through hole 86 corresponding to corresponds to the first through hole 43 is formed in each single-sided copper-cladding substrate 80 and the insulating layer 60.

In at least one embodiment, a diameter of the slot 85 decreases in a direction from the single-sided copper-cladding substrate 80 to the insulating layer 60. A diameter of the third through hole 86 is smaller than a diameter of the first through hole 43. The third through hole 86 sequentially penetrates through the copper foil layer 82, the base layer 81, the insulating layer 60, another base layer 81, and another copper foil layer 82.

Figure 18:
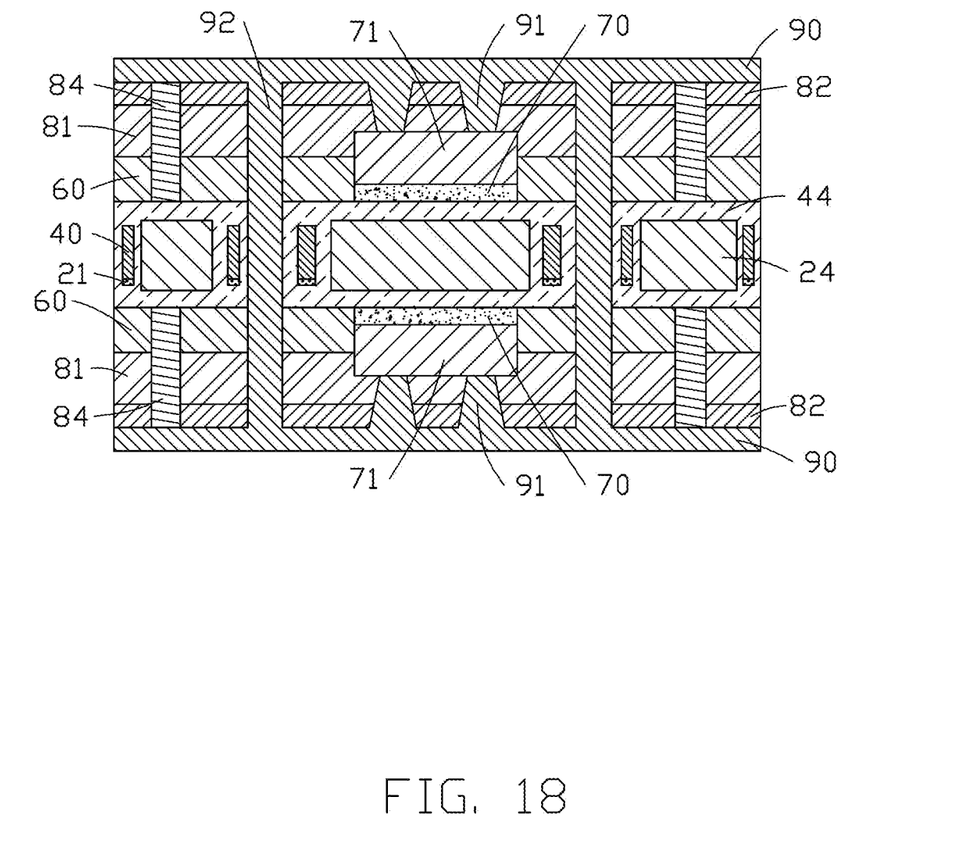
FIG. 18 is a diagrammatic view wherein a copper plating layer is disposed on the single-sided copper-cladding substrate of FIG. 17.

At block 18, referring to FIG. 18, metal is electroplated on each copper foil layers 82 to form a copper plating layer 90. The copper plating layer 90 also infills the grooves 85 and the third through holes 86 to form a first electric conductive portion 91 and a second electric conductive portion 92, respectively.

Figure 19:
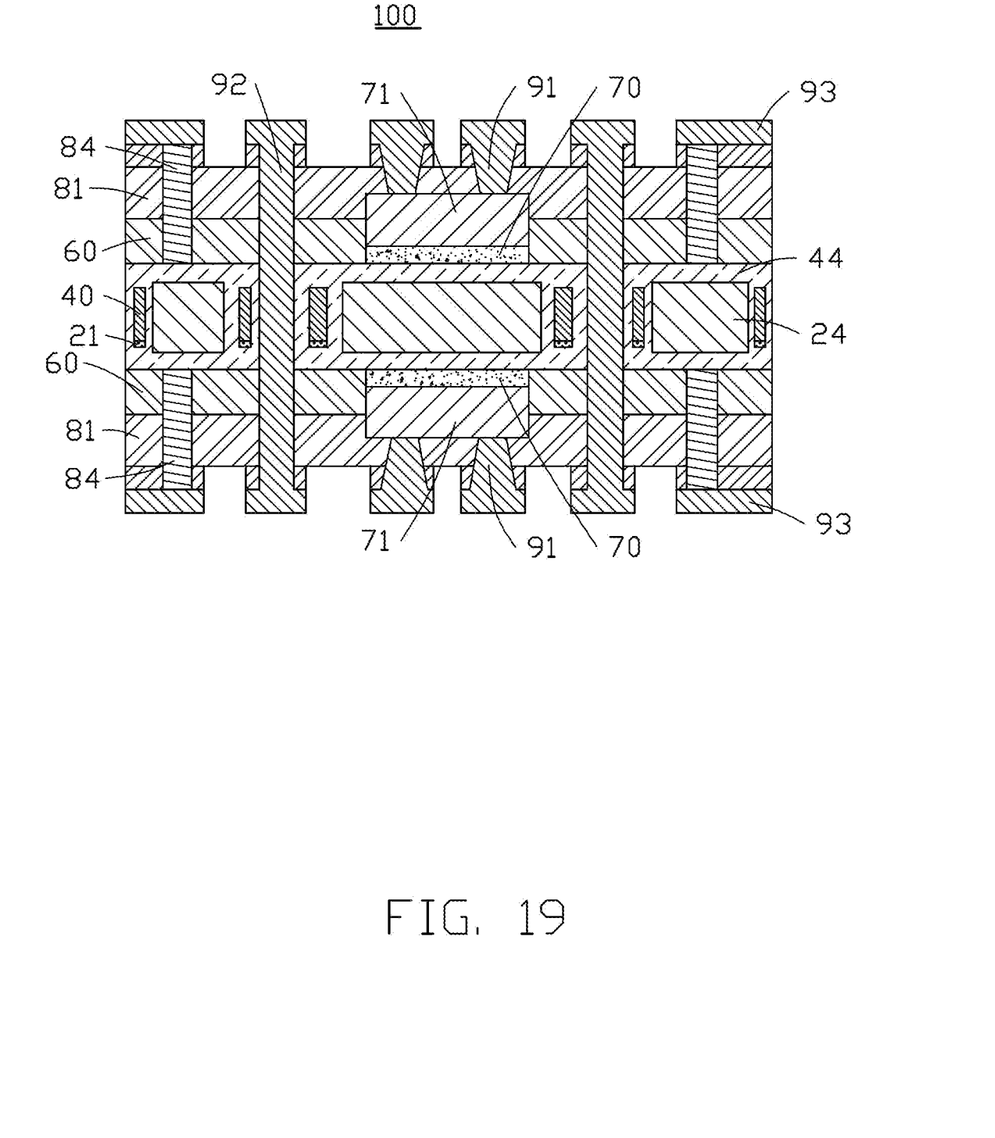
FIG. 19 is a diagrammatic view of a circuit board after the copper plating layer and the copper foil layer of FIG. 18 are etched.

At block 19, referring to FIG. 19, each copper plating layer 90 and one corresponding copper foil layer 82 are etched to form a circuit layer 93. Then, the circuit board 100 is obtained. The first electric conductive portion 91 can electrically connect the circuit layer 93 to the adjacent electronic component 71. The second electric conductive portion 92 can electrically connect the two circuit layers 93 together.

The heat generated by the each of the two circuit layers 93 can be transmitted to the phase change structure 24 through the heat conductive portion 84. The phase change structure 24 absorbs the heat, thereby reducing the temperature of the circuit layer 93.

Moreover, since the heat dissipation substrate 50 and the electronic component 71 are embedded in the circuit board 100, the overall thickness of the circuit board 100 can be reduced.

FIG. 19 illustrates an embodiment of a circuit board 100, including a heat dissipation substrate 50, two insulating layers 60, two bonding sheets 70, two electronic components 71, two base layers 81, and two circuit layers 93.

In at least one embodiment, the heat dissipation substrate 50 includes a first substrate 22 and a second substrate 42. The first substrate 22 includes a first metal layer 10. The first metal layer 10 defines a first opening 11 penetrating therethrough. A first receiving groove 12 and a first blind hole 13 are also defined in the first metal layer 10. The first receiving groove 12 and the first blind hole 13 are defined on a same surface of the first metal layer 10, and do not penetrate through the first metal layer 10.

A first phase change layer 20 is disposed in the first receiving groove 12. A solder layer 21 is disposed in the first blind hole 13. In at least one embodiment, the first phase change layer 20 fills the whole first receiving groove 12, and the solder layer 21 only fills a bottom of the first blind hole 13.

The second substrate 42 includes a second metal layer 30. A second opening 32 and a second blind hole 33 are defined in the second metal layer 30. The second opening 32 penetrates through the second metal layer 30, and the second blind hole 33 does not penetrate through the second metal layer 30.

A connecting post 40 is disposed in the second blind hole 33. An end of the connecting post 40 away from the second metal layer 30 protrudes from the surface of the second metal layer 30. A second receiving groove 41 is defined in the second metal layer 30. The second receiving groove 41 and the connecting post 40 are disposed on a same surface of the second metal layer 30, and the second receiving groove 41 does not penetrate the second metal layer 30. A second phase change layer 23 is disposed in the second receiving groove 41.

The connecting post 40 is disposed in the first blind hole 13 and connected to the solder layer 21. The first opening 11 and the second opening 32 are connected to each other to form a first through hole 43. The first metal layer 10 and the second metal layer 30 are connected to each other to form a heat conductive layer 44. The first phase change layer 20 and the second phase change layer 23 are connected to each other to form a phase change structure 24. The phase change structure 24 is wrapped by the heat conductive layer 44. The first through hole 43 penetrates through the heat dissipation substrate 50.

Each insulating layer 60 is disposed on the heat dissipation substrate 50, and also filled in the first through hole 43. A groove 61 is defined in the insulating layer 60. A bottom of the groove 61 corresponds to the heat conductive layer 44, causing the heat conductive layer 44 to partially exposed from the groove 61.

Each electronic component 71 is mounted in the groove 61 through one bonding sheet 70. The bonding sheet 70 is disposed on the heat conductive layer 44, and is in thermal conduction with the heat conductive layer 44. In at least one embodiment, the electronic component 71 may partially protrude from the insulating layer 60.

Each base layer 81 is disposed on the insulating layer 60, and the electronic component 71 is between the base layer 81 and the insulating layer 60. The portion of the electronic component 71 protruding from the insulating layer 60 can be embedded in the base layer 81.

Each circuit layer 93 is disposed on the base layer 81. A second through hole 83 is defined in the circuit layer 93, the base layer 81, and the insulating layer 60. A bottom of the second through hole 83 corresponds to the heat conductive layer 44. A heat conductive portion 84 is disposed in the second through hole 83, and is in thermal conduction with the heat conductive layer 44.

A slot 85 is defined in each circuit layer 93 and the corresponding base layer 81. A third through hole 86 corresponding to the first through hole 43 is defined in the circuit layer 93, the base layer 81, and the insulating layer 60. A bottom of the slot 85 corresponds to the electronic component 71. A first electric conductive portion 91 and a second electric conductive portion 92 are respectively disposed in the slot 85 and the third through hole 86. The first electric conductive portion 91 can electrically connect the circuit layer 93 to the adjacent electronic component 71. The second electric conductive portion 92 can electrically connect the two circuit layers 93 together.

Although the embodiments of the present disclosure have been shown and described, those having ordinary skill in the art can understand that changes may be made within the principles of the present disclosure, up to and including the full extent established by the broad general meaning of the terms used in the claims. It will, therefore, be appreciated that the embodiments described above may be modified within the scope of the claims.

What is claimed is:

1. A circuit board, comprising:
  a heat dissipation substrate comprising a phase change structure and a heat conductive layer wrapping the phase change structure, the heat dissipation substrate defining a first through hole;
  an insulating layer disposed on the heat dissipation substrate, the insulating layer defining a groove;
  an electronic component mounted in the groove and in thermal conduction with the heat conductive layer;
  a base layer disposed on the insulating layer, the electronic component being between the base layer and the insulating layer; and
  a circuit layer disposed on the base layer;

wherein a second through hole is defined in the circuit layer, the base layer, and the insulating layer, a bottom of the second through hole corresponds to the heat conductive layer, and a heat conductive portion is disposed in the second through hole;

wherein the heat dissipation substrate comprises:

a first substrate defining a first receiving groove and a first blind hole, a first phase change layer disposed in the first receiving groove, a solder layer disposed in the first blind hole, the first substrate further defining a first opening penetrating through the first substrate; and a second substrate defining a second receiving groove and a second blind hole, a second phase change layer disposed in the second receiving groove, a connecting post disposed in the second blind hole, an end of the connecting post protruding from the second substrate, the second substrate further defining a second opening penetrating through the second substrate;

wherein the connecting post is disposed in the first blind hole and connected to the solder layer, the first opening and the second opening connect to each other to form the first through hole, the first phase change layer and the second phase change layer connect to each other to form the phase change structure.

2. The circuit board of claim 1, wherein a slot is defined in the circuit layer and the base layer, a bottom of the slot corresponds to the electronic component;

wherein a third through hole is defined in the circuit layer, the base layer, and the insulating layer, the third through hole corresponds to the first through hole;

wherein a first electric conductive portion and a second electric conductive portion are respectively disposed in the slot and the third through hole, respectively.

3. The circuit board of claim 2, wherein a diameter of the slot decreases in a direction from the single-sided copper-cladding substrate to the insulating layer, and a diameter of the third through hole is smaller than a diameter of the first through hole.

4. The circuit board of claim 1, wherein the electronic component is mounted in the groove through a bonding sheet.

5. The circuit board of claim 4, wherein the bonding sheet is made of silica gel or acrylic resin.

6. The circuit board of claim 1, wherein a portion of the electronic component protrudes from the insulating layer, and the portion of the electronic component protruding from the insulating layer is embedded in the base layer.

7. The circuit board of claim 1, wherein at least one of the first phase change layer and the second phase change layer is made of paraffin, inorganic salt hydrate, or fatty acid.

* * * * *